US009601398B2

(12) United States Patent
Woychik et al.

(10) Patent No.: US 9,601,398 B2
(45) Date of Patent: Mar. 21, 2017

(54) THIN WAFER HANDLING AND KNOWN GOOD DIE TEST METHOD

(71) Applicant: Invensas Corporation, San Jose, CA (US)

(72) Inventors: Charles G. Woychik, San Jose, CA (US); Se Young Yang, San Jose, CA (US); Pezhman Monadgemi, Santa Clara, CA (US); Terrence Caskey, San Diego, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 48 days.

(21) Appl. No.: 14/500,858

(22) Filed: Sep. 29, 2014

(65) Prior Publication Data
US 2015/0014688 A1    Jan. 15, 2015

Related U.S. Application Data

(62) Division of application No. 13/593,118, filed on Aug. 23, 2012, now Pat. No. 8,846,447.

(51) Int. Cl.
*H01L 21/66* (2006.01)
*H01L 23/00* (2006.01)
(Continued)

(52) U.S. Cl.
CPC .......... *H01L 22/32* (2013.01); *G01R 31/2886* (2013.01); *H01L 21/6835* (2013.01);
(Continued)

(58) Field of Classification Search
CPC ... H01L 2224/1705; H01L 2224/81815; H01L 24/17; H01L 24/81; H01L 24/05;
(Continued)

(56) References Cited

U.S. PATENT DOCUMENTS 6,245,594 B1 *   6/2001   Wu ........................ H01L 24/11
                                                257/E21.508
6,320,254 B1 *  11/2001   Liou ....................... H01L 23/13
                                                      257/181

(Continued)

OTHER PUBLICATIONS

Liu et al. (Liu, C. N., "Matching the Thermal Coefficients of Expansion of Chips to Module Substrate", IBM Technical Disclosure Bulletin, vol. 19, No. 12, May 1977.*

*Primary Examiner* — Dale E Page
*Assistant Examiner* — John Bodnar

(57) ABSTRACT

A method of attaching a microelectronic element to a substrate can include aligning the substrate with a microelectronic element, the microelectronic element having a plurality of spaced-apart electrically conductive bumps each including a bond metal, and reflowing the bumps. The bumps can be exposed at a front surface of the microelectronic element. The substrate can have a plurality of spaced-apart recesses extending from a first surface thereof. The recesses can each have at least a portion of one or more inner surfaces that are non-wettable by the bond metal of which the bumps are formed. The reflowing of the bumps can be performed so that at least some of the bond metal of each bump liquefies and flows at least partially into one of the recesses and solidifies therein such that the reflowed bond material in at least some of the recesses mechanically engages the substrate.

15 Claims, 9 Drawing Sheets

(51) Int. Cl.

| | |
|---|---|
| *H01L 23/498* | (2006.01) |
| *G01R 31/28* | (2006.01) |
| *H01L 21/683* | (2006.01) |
| *H01L 25/04* | (2014.01) |
| *H01L 25/065* | (2006.01) |
| *H01L 25/00* | (2006.01) |

(52) U.S. Cl.
CPC ........ *H01L 22/14* (2013.01); *H01L 23/49811* (2013.01); *H01L 24/11* (2013.01); *H01L 24/16* (2013.01); *H01L 24/17* (2013.01); *H01L 24/81* (2013.01); *H01L 25/04* (2013.01); *H01L 25/0652* (2013.01); *H01L 25/50* (2013.01); *H01L 24/13* (2013.01); *H01L 2221/6834* (2013.01); *H01L 2221/68327* (2013.01); *H01L 2221/68331* (2013.01); *H01L 2221/68381* (2013.01); *H01L 2224/11015* (2013.01); *H01L 2224/11849* (2013.01); *H01L 2224/13014* (2013.01); *H01L 2224/13082* (2013.01); *H01L 2224/14131* (2013.01); *H01L 2224/14135* (2013.01); *H01L 2224/16111* (2013.01); *H01L 2224/16112* (2013.01); *H01L 2224/16146* (2013.01); *H01L 2224/16147* (2013.01); *H01L 2224/16237* (2013.01); *H01L 2224/16257* (2013.01); *H01L 2224/16267* (2013.01); *H01L 2224/16503* (2013.01); *H01L 2224/17051* (2013.01); *H01L 2224/8109* (2013.01); *H01L 2224/8114* (2013.01); *H01L 2224/81138* (2013.01); *H01L 2224/81191* (2013.01); *H01L 2224/81385* (2013.01); *H01L 2224/81815* (2013.01); *H01L 2225/06513* (2013.01); *H01L 2225/06517* (2013.01); *H01L 2225/06541* (2013.01); *H01L 2225/06565* (2013.01); *H01L 2924/00011* (2013.01); *H01L 2924/014* (2013.01); *H01L 2924/01322* (2013.01); *H01L 2924/07811* (2013.01); *H01L 2924/12* (2013.01); *H01L 2924/14* (2013.01); *H01L 2924/15788* (2013.01); *H01L 2924/181* (2013.01)

(58) Field of Classification Search
CPC . H01L 2224/05026; H01L 2224/13022; H01L 2224/13023; H01L 2224/16146; H01L 2224/16147; H01L 2224/16148
See application file for complete search history.

(56) References Cited

U.S. PATENT DOCUMENTS

| | | | |
|---|---|---|---|
| 2001/0022989 A1* | 9/2001 | Soutar | C23C 18/42 427/97.1 |
| 2003/0022603 A1* | 1/2003 | Tsao | B24B 7/228 451/57 |
| 2009/0289360 A1* | 11/2009 | Takahashi | H01L 23/49811 257/737 |
| 2013/0062764 A1* | 3/2013 | Jin | H01L 23/3114 257/738 |
| 2013/0068514 A1* | 3/2013 | Hsu | H01L 21/563 174/259 |
| 2014/0069817 A1* | 3/2014 | Dang | C25D 5/022 205/122 |

* cited by examiner

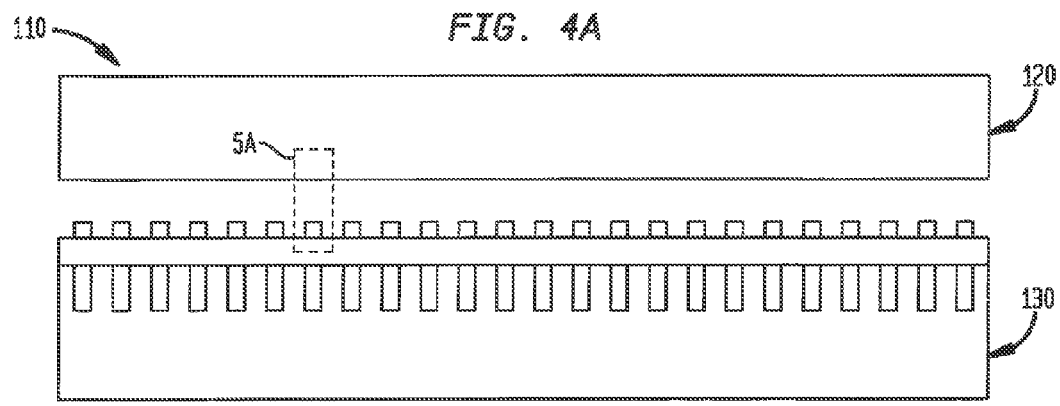
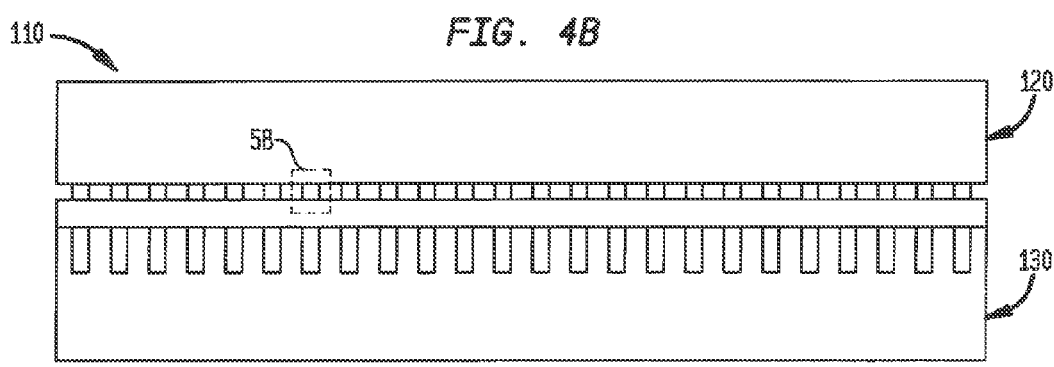
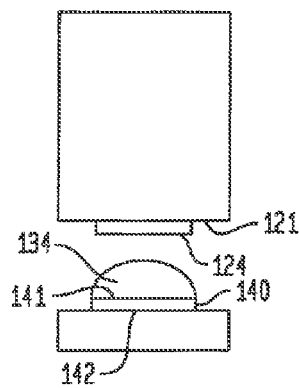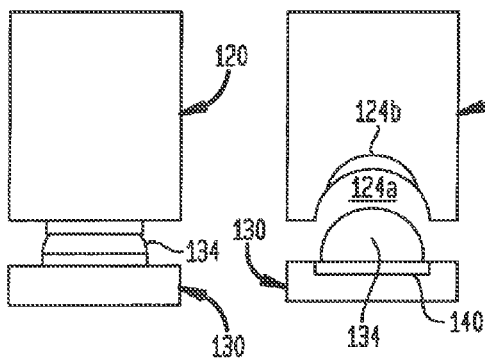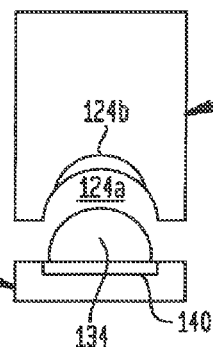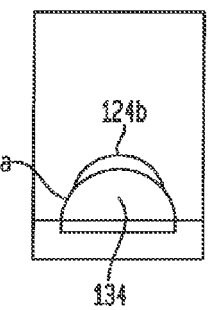

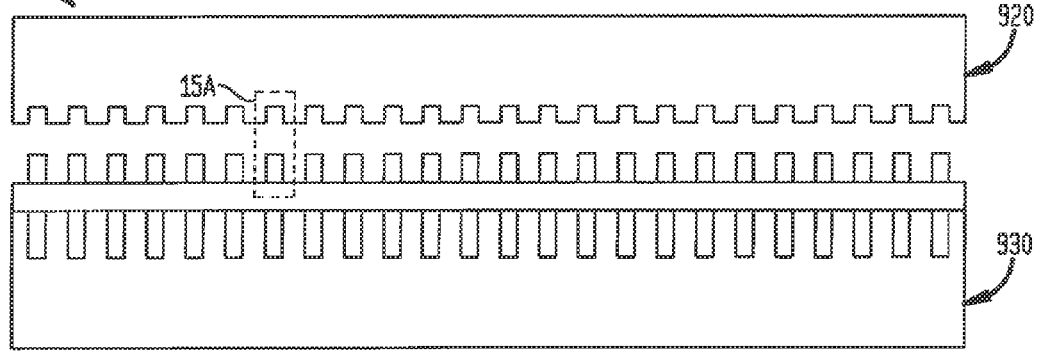
FIG. 14A
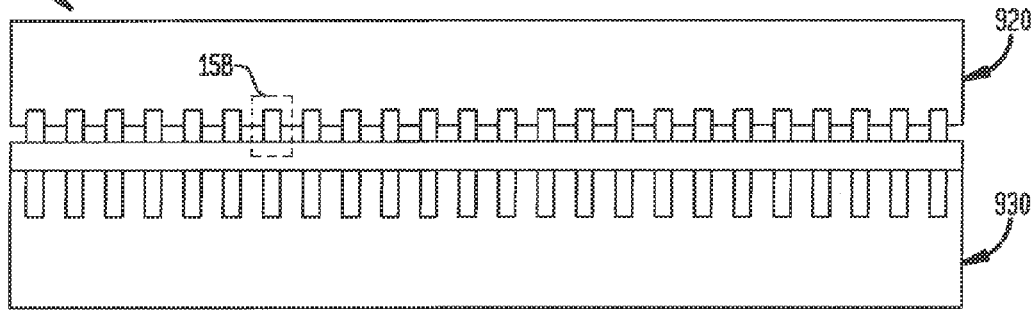
FIG. 14B
FIG. 15A     FIG. 15B     FIG. 15C
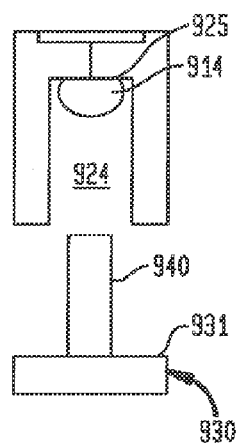 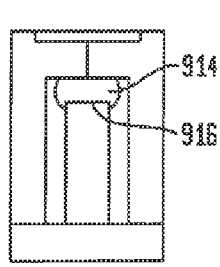 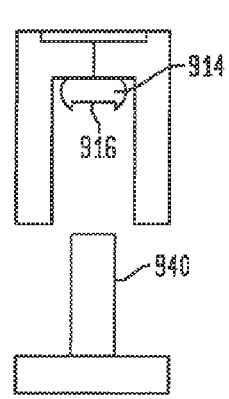

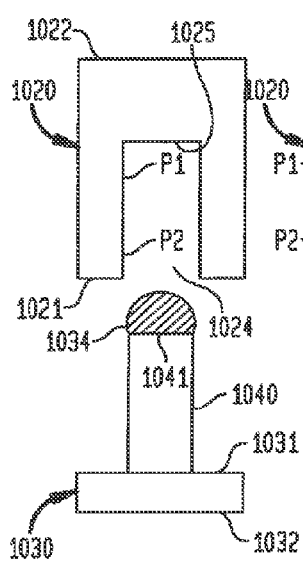 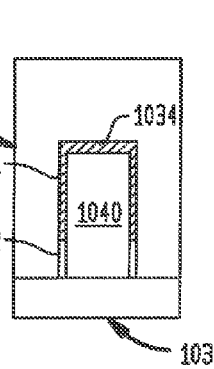 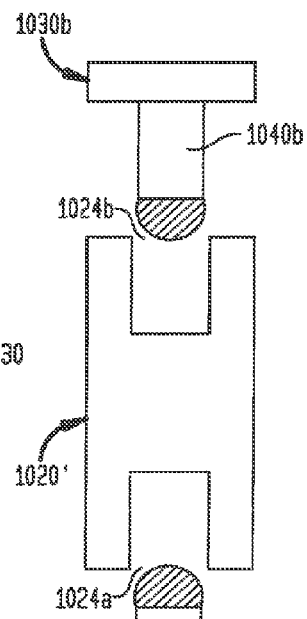 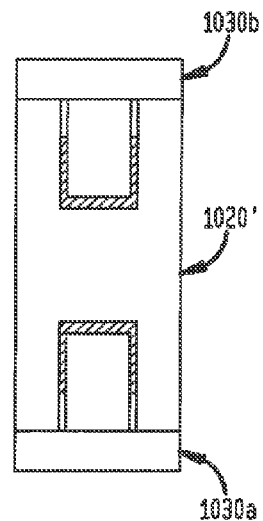
FIG. 16A  FIG. 16B  FIG. 16C  FIG. 16D
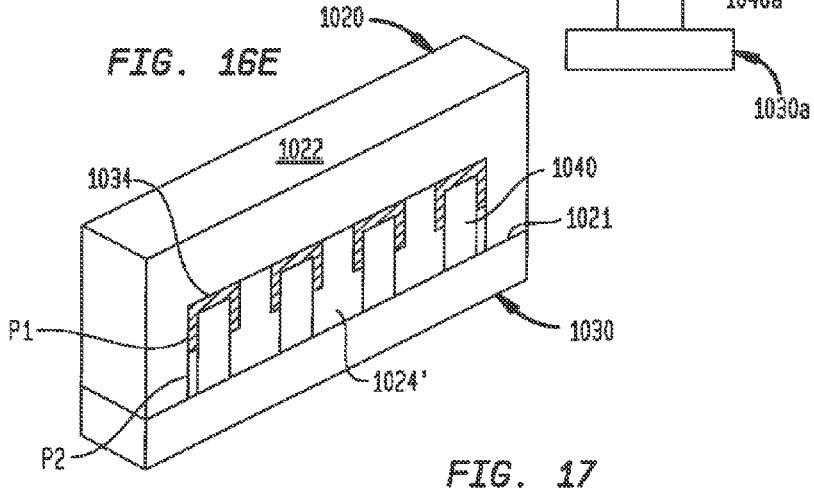
FIG. 16E
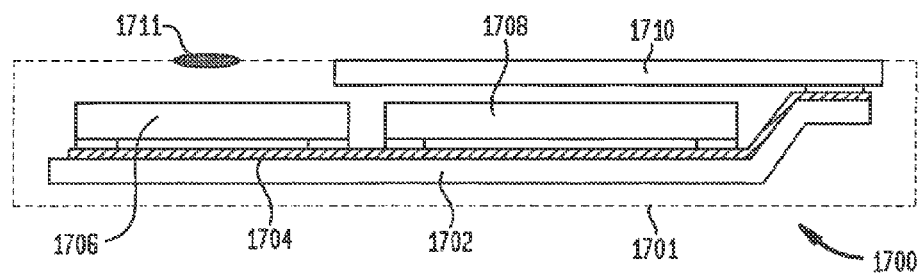
FIG. 17

THIN WAFER HANDLING AND KNOWN GOOD DIE TEST METHOD

CROSS-REFERENCE TO RELATED APPLICATION

This application is a divisional of U.S. application Ser. No. 13/593,118 (now U.S. Pat. No. 8,846,447) filed Aug. 23, 2012, the disclosure of which is incorporated by reference herein.

BACKGROUND OF THE INVENTION

The present invention relates to handling, packaging, and testing of microelectronic devices and interposer structures, and to components useful in such devices and structures.

BACKGROUND OF THE INVENTION

The present invention relates to handling, packaging, and testing of microelectronic devices and interposer structures, and to components useful in such devices and structures.

Microelectronic elements generally comprise a thin slab of a semiconductor material, such as silicon or gallium arsenide, commonly called a die or a semiconductor chip. Semiconductor chips are commonly provided as individual, prepackaged units. A standard chip has a flat, rectangular body with a front surface having contacts connected to the active circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front surface, the "area of the chip" should be understood as referring to the area of the front surface.

The active circuitry is fabricated in a first face of the semiconductor chip (e.g., a second surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

In "flip chip" designs, the front surface of the chip confronts a surface of a package substrate, i.e., a chip carrier, and the contacts on the chip are bonded directly to contacts of the chip carrier by solder balls or other connecting elements. In turn, the chip carrier can be bonded to a circuit panel through terminals overlying the front surface of the chip. The "flip chip" design provides a relatively compact arrangement; each chip occupies an area of the circuit panel equal to or slightly larger than the area of the chip's front surface, such as disclosed, for example, in certain embodiments of commonly-assigned U.S. Pat. Nos. 5,148,265, 5,148,266, and 5,679,977, the disclosures of which are incorporated herein by reference.

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel. It can be difficult to handle and move very thin chips during fabrication, and it can be difficult to test such chips for known good dies.

It has also been proposed to package plural chips in a "stacked" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,148,265, 5,679,977, and U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in handling, packaging, and testing of microelectronic devices and interposer structures, there is still a need for improvements in order to minimize the size of semiconductor chips and interposer structures, while enhancing electrical interconnection reliability. These attributes of the present invention may be achieved by the construction of the components and the methods of fabricating components as described hereinafter.

BRIEF SUMMARY OF THE INVENTION

In accordance with an aspect of the invention, a method of attaching a microelectronic element to a substrate can include aligning the substrate with a microelectronic element, the microelectronic element having a plurality of spaced-apart electrically conductive bumps each including a bond metal, and reflowing the bumps. The bumps can be exposed at a front surface of the microelectronic element. The substrate can have a plurality of spaced-apart recesses extending from a first surface thereof. The recesses can each have at least a portion of one or more inner surfaces that are non-wettable by the bond metal of which the bumps are formed. The reflowing of the bumps can be performed so that at least some of the bond metal of each bump liquefies and flows at least partially into one of the recesses and solidifies therein such that the reflowed bond material in at least some of the recesses mechanically engages the substrate.

In one embodiment, the substrate can be a handling substrate, and all of the inner surfaces of at least some of the recesses can be non-wettable by the bond metal of which the bumps are formed. In a particular example, the microelectronic element can be a first microelectronic element and the substrate is a second microelectronic element, each of the microelectronic elements having at least one of active or passive devices therein. In an exemplary embodiment, at least 50% of the surface area of the inner surfaces of at least some of the recesses can be first portions that are wettable by the bond metal of which the bumps are formed, and at least 25% of the surface area of the inner surfaces of the at least some of the recesses can be second portions that are non-wettable by the bond metal of which the bumps are formed. The non-wettable surface area can be adjacent to the first surface of the substrate and can separate the wettable surface area from the first surface.

In one example, the first portions of the surface area of the at least some of the recesses can each include a plurality of discontinuous portions. In a particular embodiment, each of the bumps can be disposed at an end of a solid metal pillar, each solid metal pillar having a base adjacent the front surface of the microelectronic element, the end being remote from the base. In one embodiment, the aligning step can include inserting at least some of the solid metal pillars into corresponding ones of the recesses. In a particular example, each of the bumps can contact at least a portion of a height of the sidewalls of the solid metal pillar on which it is disposed, the height of the sidewalls of each solid metal pillar extending between the base and the end thereof in a direction perpendicular to the front surface of the microelectronic element. In an exemplary embodiment, each of the bumps can contact 10% or less of the height of the sidewalls of the solid metal pillar on which it is disposed. In one example, 90% or more of the height of the sidewalls of each of the solid metal pillars can be non-wettable by the bond metal of which the bumps are formed.

In a particular embodiment, each of the bumps can be disposed on the front surface of the microelectronic element. In one embodiment, each of the bumps can be disposed at a top surface of a conductive pad, each conductive pad having a bottom surface adjacent the front surface of the microelectronic element, the top surface being remote from the bottom surface. In a particular example, after the reflowing step, the at least some of the bumps can each define an upper surface that confronts and is spaced apart from at least one upper surface of the corresponding one of the recesses into which the bump flows. In an exemplary embodiment, the at least some of the recesses can each have at least one surface reentrant with respect to the first surface of the substrate to permit the mechanical engagement of the reflowed bond metal therein. In one example, after the reflowing step, the at least some of the bumps can each define a first width within the corresponding one of the recesses in a first direction parallel to the first surface of the substrate greater than a second width of the corresponding one of the recesses in the first direction, the second width located between the first width and the first surface.

In a particular embodiment, the at least some of the recesses can each have an entry portion and a transverse portion, the entry portion extending from the first surface of the substrate in a first direction towards a second opposed surface thereof, the transverse portion extending in a second direction transverse to the first direction away from the entry portion, the transverse portion having therein at least one surface reentrant with respect to the first surface. In one embodiment, at least some of the non-wettable inner surfaces of the recesses can include a layer of non-wettable dielectric material overlying an inner surface of the substrate. In a particular example, the reflowing step can be performed while the bumps are subject to a vacuum pressure that is less than atmospheric pressure or an inert or reducing ambient environment. In an exemplary embodiment, at least some of the bumps can be reflowed into a single common recess.

In one example, at least some of the recesses can each include a conductive surface exposed at one or more of the inner surfaces thereof. The reflowed bond material in the at least some of the recesses can contact the corresponding conductive surface. In a particular embodiment, the reflowing step can include the reflowed bond material of at least some of the bumps at least partially forming an intermetallic bond with the corresponding ones of the conductive surfaces. In one embodiment, the method can also include, after the reflowing step, electrically testing the microelectronic element through electrical connections made through the substrate and the reflowed bond metal. In a particular example, the method can also include, after the reflowing step, reducing a thickness of the microelectronic element by removing material from a rear surface thereof opposite the front surface.

In an exemplary embodiment, the method can also include, after the reflowing step, moving the microelectronic element by moving the substrate with the microelectronic element attached thereto. In one example, during the moving step, a retention force can be applied by the reentrant surfaces onto the reflowed bond material. In a particular embodiment, the retention force can be at least 2 psi. In one embodiment, the method can also include, after the moving step, detaching the microelectronic element from the substrate by reflowing the bumps so that at least some of the bond metal thereof liquefies and flows out of the corresponding ones of the recesses. In a particular example, the at least some of the bumps can each have an initial volume before the at least some of the bond material thereof flows into the corresponding ones of the recesses and a final volume after the at least some of the bond material thereof flows out of the corresponding ones of the recesses, and the final volume can be within 10% of the initial volume. In an exemplary embodiment, the substrate can have at least some portions that are translucent or transparent between the first surface and a second surface opposite therefrom, such that, during the aligning step, at least a portion of the microelectronic element is visible to an imaging device through a thickness of the substrate.

In one example, a method of moving a plurality of microelectronic elements can include placing a first microelectronic element atop a package substrate such that at least some electrically conductive bumps exposed at a first surface of the first microelectronic element are aligned with conductive elements exposed at a surface of the package substrate, and attaching a second microelectronic element to a substrate by the method described above. The method can also include moving the second microelectronic element to a position atop the first microelectronic element so that a rear surface of the second microelectronic element confronts a second surface of the first microelectronic element opposite the first surface thereof. The bumps of the second microelectronic element can be first bumps. Bond metal of at least some second electrically conductive bumps exposed at the rear surface of the second microelectronic element can contact corresponding conductive elements exposed at the second surface of the first microelectronic element.

The method can also include reflowing the bumps of the first and second microelectronic elements such that the bond metal of at least some of the first bumps of the second microelectronic element reflows and disengages from the recesses of the substrate, such that bond metal of at least some of the second bumps of the second microelectronic element bonds with corresponding ones of the conductive elements of the first microelectronic element, and such that bond metal of at least some of the bumps of the first microelectronic element bonds with corresponding ones of the conductive elements of the package substrate. In a particular embodiment, during the step of reflowing the bumps of the first and second microelectronic elements, the at least some of the second bumps can self-align with the corresponding conductive elements exposed at the second surface of the first microelectronic element.

In accordance with another aspect of the invention, a method of attaching a microelectronic element to a substrate can include aligning the substrate with a microelectronic element, the microelectronic element having a plurality of spaced-apart electrically conductive bumps each including a bond metal, and reflowing the bumps. The bumps can be exposed at a front surface of the microelectronic element. The substrate can have a plurality of spaced-apart conductive surfaces exposed at a first surface thereof. The reflowing of the bumps can be performed so that at least some of the bond metal thereof liquefies and solidifies in contact with corresponding ones of the conductive surfaces such that the reflowed bond material contacting the corresponding ones of the conductive surfaces mechanically engages the substrate.

In one embodiment, the reflowing step can includes the reflowed bond material of at least some of the bumps at least partially forming an intermetallic bond with the corresponding ones of the conductive surfaces. In a particular example, each of the bumps can be disposed at a top surface of a conductive element of the microelectronic element, each top surface being exposed at the front surface of the microelectronic element.

In accordance with yet another aspect of the invention, a method of testing a microelectronic element can include aligning a testing substrate with a microelectronic element. The microelectronic element can have a plurality of spaced-apart electrically conductive protrusions exposed at a front surface thereof. The testing substrate can have a plurality of spaced-apart recesses extending from a first surface thereof. At least some of the recesses can each include a compliant electrically conductive element exposed at an inner surface thereof. Each compliant element can be electrically connected with a component that is configured to electrically test the microelectronic element. The method can also include deformably engaging the compliant elements of the testing substrate with corresponding ones of the protrusions of the microelectronic element, the protrusions extending into interior cavities of the compliant elements defined by the protrusions. The method can also include electrically testing the microelectronic element while the protrusions are engaged with the compliant elements and withdrawing the protrusions from the recesses.

In an exemplary embodiment, each protrusion can be a solid metal pillar having a base adjacent the front surface of the microelectronic element and an end remote from the base, and at least the ends of the pillars can contact the compliant elements during the deformably engaging step. In one example, each compliant element can consist essentially of a compliant metal or metal alloy. In a particular embodiment, each compliant element can have a tip that protrudes away from the inner surface of the respective recess. In one embodiment, at least a portion of each compliant element can include a conductive fluid therein. In a particular example, the method can also include, after the electrically testing step, reflowing the compliant elements to remove the interior cavities of the compliant elements that were defined by the protrusions. In an exemplary embodiment, the withdrawing and reflowing steps can be performed simultaneously.

In accordance with still another aspect of the invention, a microelectronic assembly can include a first substrate having a plurality of spaced-apart recesses extending from a first surface thereof, a second substrate having a plurality of spaced-apart solid metal pillars exposed at a first surface thereof, and a plurality of electrically conductive bumps each including a bond metal. Each pillar can extend into one of the recesses. Each pillar can have a base adjacent the first surface of the second substrate and an end remote from the base. Each bump can be exposed at the end of a corresponding one of the pillars. At least some of the bond metal of each bump can be at least partially disposed in corresponding ones of the recesses and solidified therein such that the bond material in at least some of the recesses at least one of mechanically or electrically engages the first substrate. A first portion of the surface area of inner surfaces of at least some of the recesses can be wettable by the bond metal of which the bumps are formed. A second portion of the surface area of the inner surfaces of the at least some of the recesses can be non-wettable by the bond metal of which the bumps are formed. The second portion can be adjacent the first surface of the first substrate and can separate the first portion from the first surface of the first substrate.

In one example, at least some of the first portion or at least some of the second portion can include a plurality of discontinuous portions. In a particular embodiment, at least some of the pillars can extend into a single common one of the recesses. In one embodiment, at least one of the first and second substrates can be a microelectronic element having at least one of active or passive devices therein. In a particular example, the recesses can be a first plurality of recesses and the bumps can be a first plurality of bumps, the first substrate having a second plurality of spaced-apart recesses extending from a second surface thereof opposite the first surface. The microelectronic assembly can also include a third substrate having a plurality of spaced-apart solid metal pillars exposed at a first surface thereof, each pillar of the third substrate extending into a corresponding one of the second plurality of recesses, each pillar of the third substrate having a base adjacent the first surface of the third substrate and an end remote from the base. The microelectronic assembly can also include a second plurality of electrically conductive bumps each including a bond metal, each of the second plurality of bumps exposed at the end of a corresponding one of the pillars of the third substrate, at least some of the bond metal of each of the second plurality of bumps at least partially disposed in corresponding ones of the second recesses and solidified therein such that the bond material in at least some of the second recesses mechanically engages the third substrate.

In accordance with another aspect of the invention, a handling substrate can include a body having first and second opposed surfaces, a plurality of spaced-apart recesses extending from the first surface, the recesses each having inner surfaces that are non-wettable by a bond metal, and a plurality of conductive elements each exposed at at least one of the inner surfaces of a corresponding one of the recesses. At least some of the conductive elements can be electrically connected with a component that is configured to electrically test the microelectronic element.

In an exemplary embodiment, the body of the handling substrate can have an effective CTE in a plane of the handling substrate parallel to the first surface thereof of less than 5 ppm/° C. In one example, the body of the handling substrate can consist essentially of glass or silicon. In a particular embodiment, the at least some of the recesses can each have at least one surface reentrant with respect to the first surface. In one embodiment, the at least some of the recesses can each have an entry portion and a transverse portion, the entry portion extending from the first surface in a first direction towards the second surface, the transverse portion extending in a second direction transverse to the first direction away from the entry portion, the transverse portion having therein at least one of the reentrant surfaces.

In a particular example, at least some of the non-wettable inner surfaces of the recesses can include a layer of non-wettable dielectric material overlying an inner surface of the handling substrate. In an exemplary embodiment, each conductive element can have a tip that protrudes away from the at least one of the inner surfaces of the respective recess. In one example, an exposed surface of each of the conductive elements can be non-wettable by a bond metal. In a particular embodiment, the handling substrate can include at least a first region consisting essentially of semiconductor material underlying the first surface and extending from a first peripheral edge of the substrate to a second peripheral edge of the substrate opposed thereto. In one embodiment, the handling substrate can also include a region of dielectric material overlying the first region, and the recesses can be disposed at least partially within the second region.

In accordance with yet another aspect of the invention, a method of attaching a microelectronic element to a substrate can include aligning the substrate with a microelectronic element, the microelectronic element having a plurality of spaced-apart bumps each including a reflowable material, and reflowing the bumps. The bumps can be exposed at a front surface of the microelectronic element. The substrate ca have a plurality of spaced-apart recesses extending from a first surface thereof. The recesses can each have at least a portion of one or more inner surfaces that are non-wettable by the material of which the bumps are formed. The reflowing of the bumps can be performed so that at least some of the material of each bump liquefies and flows at least partially into one of the recesses and solidifies therein such that the reflowed material in at least some of the recesses mechanically engages the substrate. In a particular example, the material can be electrically conductive. In an exemplary embodiment, the material may not be electrically conductive.

In accordance with still another aspect of the invention, an in-process assembly can include a handling substrate having a plurality of spaced-apart recesses extending from a first surface thereof, and a microelectronic element mechanically engaged with the handling substrate by a plurality of spaced-apart electrically conductive bumps each including a bond metal. The bumps can be exposed at a front surface of the microelectronic element. At least some of the bumps can extend at least partially into corresponding ones of the recesses. The recesses can each have inner surfaces that are non-wettable by the bond metal of which the bumps are formed.

In one example, each of the bumps can be disposed at an end of a solid metal pillar, each solid metal pillar having a base adjacent the front surface of the microelectronic element, the end being remote from the base. In a particular embodiment, the ends of at least some of the solid metal pillars can be disposed within corresponding ones of the recesses. In one embodiment, the corresponding ones of the recesses can each have at least one surface reentrant with respect to the first surface of the handling substrate to permit the mechanical engagement of the bond metal therein. In a particular example, the microelectronic element can include at least one of active or passive devices therein. In an exemplary embodiment, the microelectronic element can have edges bounding the front surface thereof and can be attached at the edges to a plurality of additional microelectronic elements. In one example, the microelectronic element and the additional microelectronic elements can constitute a wafer.

Further aspects of the invention provide systems that incorporate structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIGS. 4A and 4B are side sectional views of a handling substrate and a microelectronic element in respective disengaged and engaged positions, illustrating an apparatus in accordance with another embodiment.

FIG. 5A is an enlarged side sectional view of a portion of the handling substrate and microelectronic element of FIG. 4A.

FIG. 5B is an enlarged side sectional view of a portion of the handling substrate and microelectronic element of FIG. 4B.

FIGS. 5C and 5D are potential enlarged side sectional views of the handling substrate and microelectronic element of FIGS. 4A and 4B in accordance with an alternative embodiment.

FIGS. 14A and 14B are side sectional views of a testing substrate and a microelectronic element in respective disengaged and engaged positions, illustrating an apparatus in accordance with still another embodiment.

FIG. 15A is an enlarged side sectional view of a portion of the handling substrate and microelectronic element of FIG. 14A.

FIG. 15B is an enlarged side sectional view of a portion of the handling substrate and microelectronic element of FIG. 14B.

FIG. 15C is an enlarged side sectional view of a portion of the handling substrate and microelectronic element of FIGS. 14A and 14B, showing deformation in the compliant elements of the testing substrate.

FIGS. 16A and 16B are enlarged side sectional views of a portion of a first substrate and a second substrate in respective disengaged and engaged positions, illustrating an apparatus in accordance with yet another embodiment.

FIGS. 16C and 16D are enlarged side sectional views of a portion of first, second, and third substrates in respective disengaged and engaged positions, illustrating an apparatus in accordance with still another embodiment.

FIG. 16E is an enlarged side sectional view of a variation of the first and second substrates of FIG. 16A having a common recess.

FIG. 17 is a schematic depiction of a system according to one embodiment of the invention.

DETAILED DESCRIPTION

Figure 1A:
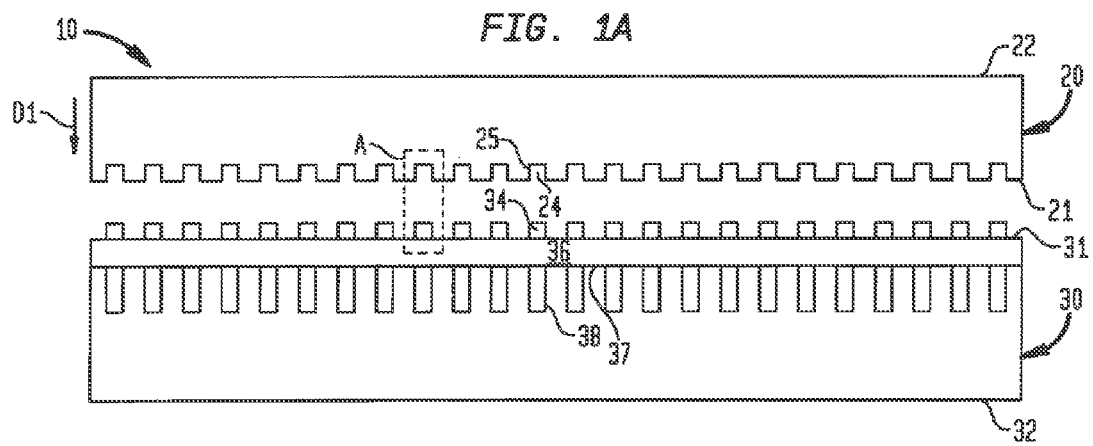
FIGS. 1A and 1B are side sectional views of a handling substrate and a microelectronic element in respective disengaged and engaged positions, illustrating an apparatus in accordance with an embodiment of the invention.
Figure 1B:
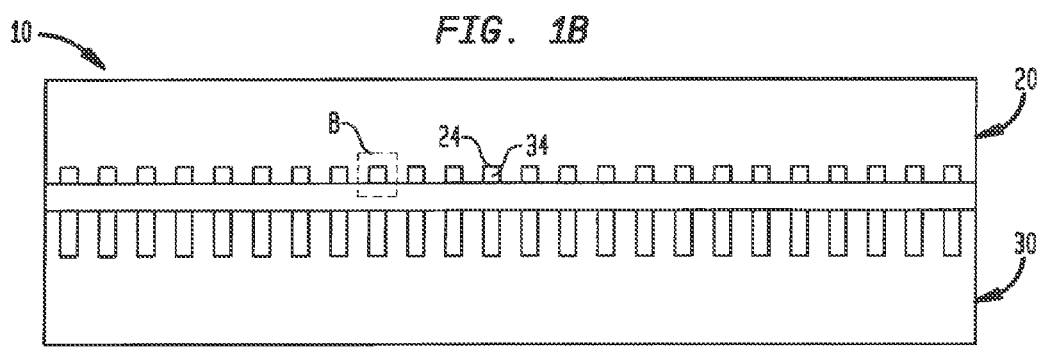

As illustrated in FIGS. 1A and 1B, an assembly 10 can include a handling substrate 20 and a microelectronic element 30. The handling substrate 20 can have a first surface 21 and a second surface 22 opposite therefrom, and a plurality of spaced-apart recess 24 extending from the first surface towards the second surface. The microelectronic element 30 can have a front surface of first surface 31 and a rear surface or second surface 32 opposite therefrom, and a plurality of spaced-apart bumps 34 each including a bond material and each exposed at the front surface of the microelectronic element.

The handling substrate 20 and the microelectronic element 30 can be disengaged from one another, as shown in FIG. 1A, and they can be mechanically engaged with one another through interlocking of bumps 34 of the microelectronic element with corresponding recesses 24 of the handling substrate, as shown in FIG. 1B.

In FIG. 1A, the directions parallel to the first surface 21 of the handling substrate or the front surface 31 of the microelectronic element 30 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure, a statement that an electrically conductive element is "exposed at" a surface of a substrate indicates that the electrically conductive element is available for contact with a theoretical point moving in a direction perpendicular to the surface of the substrate toward the surface of the substrate from outside the substrate. Thus, a terminal or other conductive element which is exposed at a surface of a substrate may project from such surface; may be flush with such surface; or may be recessed relative to such surface and exposed through a hole or depression in the substrate.

In some embodiments, the handling substrate 20 may be made of semiconductor material, glass, ceramic, or other materials. The handling substrate 20 preferably has a coefficient of thermal expansion ("CTE") less than $10*10^{-6}/°$ C. (or ppm/° C.). In a particular embodiment, the handling substrate 20 can have a CTE less than 7 ppm/° C.

The handling substrate 20 can further include an insulating dielectric layer overlying inner surfaces 25 of the recesses 24. Such a dielectric layer can also overlie some or all of the first surface 21 of the handling substrate 20. Such a dielectric layer can electrically insulate conductive elements from the material of the handling substrate 20. The dielectric layer can include an inorganic or organic dielectric material or both. The dielectric layer may include an electrodeposited conformal coating or other dielectric material, for example, a photoimageable polymeric material, for example, a solder mask material. In a particular example, such a dielectric layer can consist essentially of a material that is non-wettable by solder or other electrically conductive bond metals, for example, Teflon (i.e, PTFE) or Parylene. In particular embodiments in which the handling substrate 20 consists essentially of dielectric material (e.g., glass or ceramic), the insulating dielectric layer described above may be omitted.

In the embodiments described herein, a dielectric layer overlying the inner surfaces 25 of the recesses 24 and the first surface 21 of the handling substrate 20 can have a thickness that is substantially less than a thickness of the handling substrate, such that the handling substrate can have an effective CTE that is approximately equal to the CTE of the material of the jandling substrate, even if the CTE of the dielectric layer is substantially higher than the CTE of the substrate material. In one example, the substrate 20 can have an effective CTE less than 10 ppm/° C.

In one example, the handling substrate 20 can have at least some portions that are translucent or transparent between the first and second surfaces 21, 22, such that, during alignment or engagement of the handling substrate and the microelectronic element 30, at least a portion of the microelectronic element can be visible to an imaging device through a thickness of the handling substrate.

The plurality of spaced-apart recesses 24 can extend from the first surface 21 towards the second surface 22 partially or completely through a thickness of the handling substrate towards the second surface 22. In the embodiment shown in FIG. 1A, the recesses 24 each extend partially through the handling substrate 20 between the first and second surfaces 21, 22. The recesses 24 can be arranged in any top-view geometric configuration, including for example, an m×n array, each of m and n being greater than 1.

Figure 3A:
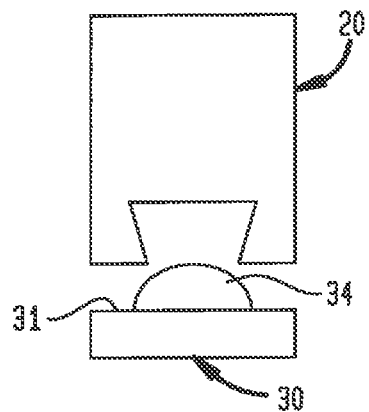
FIG. 3A is another potential enlarged side sectional view of a portion of the handling substrate and microelectronic element of FIG. 1A.
Figure 3B:
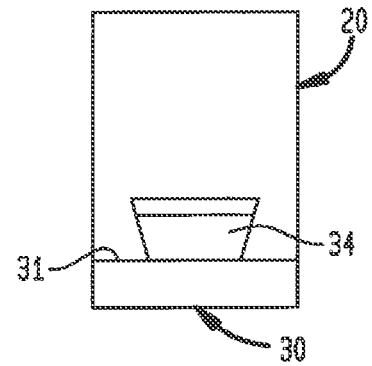
FIG. 3B is another potential enlarged side sectional view of a portion of the handling substrate and microelectronic element of FIG. 1B.

Each recess 24 includes one or more inner surfaces 25 that extend from the first surface 21 at least partially through the handling substrate 20 at an angle between 0 and 90 degrees to the horizontal plane defined by the first surface. Each inner surface 25 can have a constant slope or a varying slope. For example, the angle or slope of the inner surface 25 relative to the horizontal plane defined by the first surface 21 can decrease in magnitude (i.e., become less positive or less negative) as the inner surface penetrates further towards the second surface 22. In a particular embodiment, each recess 24 can be tapered in a direction from the first surface 21 towards the second surface 22 (e.g., as shown in FIGS. 3A and 3B. In some examples, each recess 24 can have any three-dimensional shape, including for example, a frusto-conical shape, a cylinder, a cube, a prism, an elliptic paraboloid, a hyperboloid, or a structure bounded by a curvilinear inner surface, among others. As used herein, when a three-dimensional structure is described as having or being bounded by a curvilinear surface, a cross-section of that surface in a plane that is generally perpendicular to the first and second surfaces of the substrate is a curve having a varying slope (e.g., a second order polynomial).

In one example, one or more recesses extending into the handling substrate 20 can be replaced by a single common recess 24', for example, as described below with respect to FIG. 2C. In particular embodiments, the recesses 24 and any of the other openings described herein can have various shapes, as described for example in U.S. patent application Ser. Nos. 12/842,717 and 12/842,651, filed Jul. 23, 2010, which are hereby incorporated by reference herein, and such openings can be formed using exemplary processes as described in the aforementioned applications.

An exemplary microelectronic element 30 is illustrated in FIG. 1A. The microelectronic element 30 may have supporting structure or a layer consisting essentially of an inorganic material such as silicon. The thickness of the microelectronic element 30 between the first surface 31 and the second surface 32 typically is less than 500 µm, and can be significantly smaller, for example, 130 µm, 70 µm or even smaller. In a particular embodiment, the microelectronic element 30 can be an interposer made from a material such as semiconductor material, ceramic, glass, a composite material such as glass-epoxy or a fiber-reinforced composite, a laminate structure, or a combination thereof. In one example, the microelectronic element 30 can consist essentially of a material having an effective CTE in a plane of the substrate of no more than 10 ppm/° C.

In one example, the microelectronic element 30 can be a semiconductor wafer which may include a plurality of semiconductor chips, each being an integral portion of the wafer, wherein a semiconductor region of the wafer is continuous throughout the area of the wafer. A wafer can have a 200 mm, 300 mm, or other diameter, and may have a round shape or other shape. In another example, the microelectronic element 30 can be a portion of a semiconductor wafer having a plurality of semiconductor chips each being an integral portion thereof. Alternatively, portions of the wafer such as a plurality of semiconductor chips thereof may be attached to each other at respective edges of the semiconductor chips by a dielectric material such as a molding compound, for example, or attached by other suitable binding material.

In yet another embodiment, the microelectronic element 30 can be or can include a semiconductor chip, which may be a bare semiconductor chip, or which may include one or more additional conductive layers at least partially overlying one or both opposite faces of the semiconductor chip. The semiconductor chip may either be packaged or unpackaged. In a particular embodiment, the microelectronic element 30 can include a plurality of vertically stacked semiconductor chips having respective major surfaces overlying one another and parallel to one another, wherein the semiconductor chips therein may or may not be electrically interconnected with one another. Further variations or combinations of semiconductor chips with other components, metallizations, circuitry, etc. are contemplated within the meaning of "microelectronic element" as used herein.

Figure 11A:
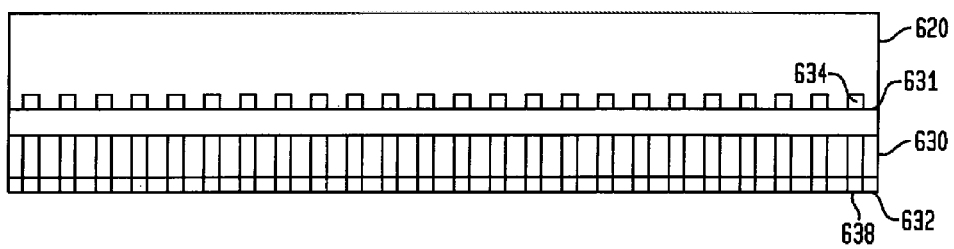
FIG. 11A is a side sectional view of the handling substrate and microelectronic element of FIGS. 1A and 1B, shown with the microelectronic element thinned from a rear surface thereof.
Figure 11B:
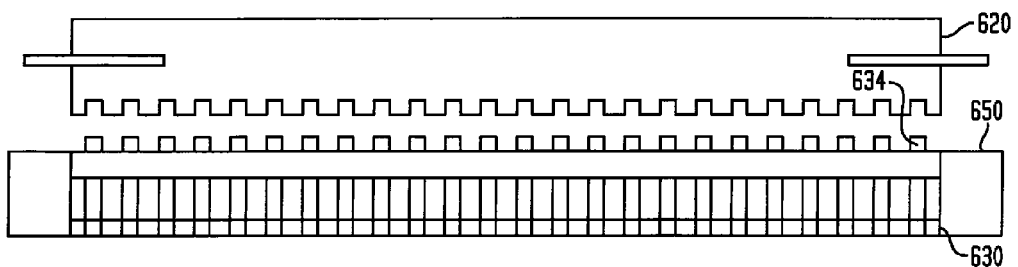
FIG. 11B is a side sectional view of the handling substrate and microelectronic element of FIG. 11A, shown with the microelectronic element clamped and disengaged from the handling substrate.

The microelectronic element can include a topside BEOL 36 adjacent the first surface 31 and a plurality of conductive vias or through-silicon-vias (TSVs) 38 each extending from the topside BEOL towards the second surface 32. The plurality of conductive vias 38 may be exposed at the second surface 32 after thinning of the microelectronic element 30, for example, as shown in FIGS. 11A and 11B.

In embodiments where the microelectronic element 30 includes a semiconductor substrate, made for example from silicon, one or a plurality of semiconductor devices (e.g., transistors, diodes, etc.) can be disposed in one or more active device regions thereof located at and/or below the first surface 31. In one example, the active device regions can be located adjacent a rear surface 37 of the topside BEOL 36.

The plurality of conductive vias 38 of the microelectronic element 30 can extend from the first surface 31 or the rear surface 37 of the topside BEOL 36 towards the rear surface 32. In a particular embodiment, first and second conductive vias 38 of a particular microelectronic element 30 can be connectable to respective first and second electric potentials. The conductive vias 38 can each include a metal such as copper, aluminum, tungsten, an alloy including copper, an alloy including nickel, an alloy including tin, or an alloy including tungsten, among others.

The bumps 34 each can include a bond metal or other electrically conductive joining material (e.g., solder, a conductive adhesive, or a conductive paste) exposed at the front surface 31 of the microelectronic element 30, such that the bumps can be electrically conductive. Such a conductive joining material can comprise a fusible metal having a relatively low melting temperature, e.g., solder, tin, or a eutectic mixture including a plurality of metals. Alternatively, such conductive joining material can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive joining material can include a conductive material interspersed in a medium, e.g., a conductive paste, e.g., metal-filled paste, solder-filled paste or isotropic conductive adhesive or anisotropic conductive adhesive.

In any of the embodiments described herein, the bumps 34 can include a joining material that is not electrically conductive, such as glass frit or a non-electrically conductive paste. Such bumps 34 can be used in embodiments where it is not necessary or desired to have an electrical connection between the handling substrate 20 and the microelectronic element 30, for example, when the handling substrate and the microelectronic element are joined to one another for heat management or mechanical support of the microelectronic element, the handling substrate, or both. In such embodiments where the bumps 34 include a joining material that is not electrically conductive, such as glass frit, the handling substrate 20 can include a layer of material overlying the inner surfaces 25 of the recesses 24, such layer of material being non-wettable by the material of the bumps. Examples of such materials that may be used for the layer overlying the inner surfaces 25 include non-stick materials such as Teflon (PTFE) or non-stick self assembly nanofilms.

Figure 1C:
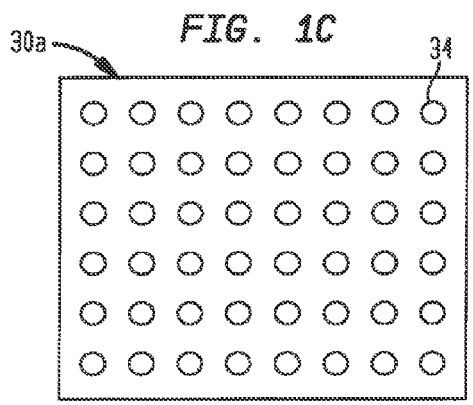
FIGS. 1C and 1D are exemplary top plan views of the microelectronic element of FIGS. 1A and 1B, showing potential arrangements of the bumps.
Figure 1D:
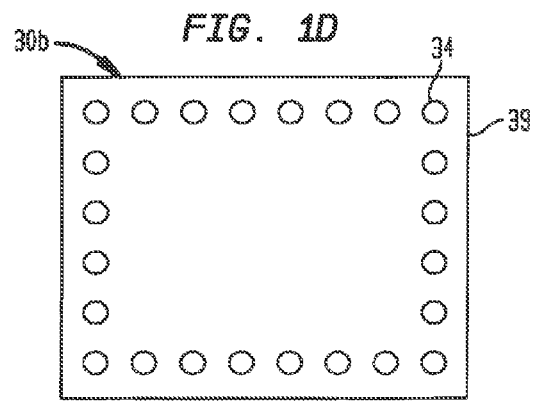

The bumps 34 can have any width and height. For example, the width of the bumps 34 may be 10 microns, 30 microns, 50 microns, 100 microns, 50-100 microns, or 30-1000 microns. In some examples, the height of the bumps 34 may be 10 microns, 30 microns, 50 microns, 100 microns, 50-100 microns, or 30-1000 microns. The width and height of the bumps may be the same, or they may be different. The bumps 34 can be arranged in any top-view geometric configuration, including for example, an m×n array, each of m and n being greater than 1, as shown in FIG. 1C. In a particular embodiment, the bumps 34 can all be disposed adjacent a peripheral edge 39 of the front surface 31 of the microelectronic element 30, as shown in FIG. 1D. In an exemplary embodiment, the arrangement of bumps 34 may define a minimum pitch between adjacent ones of the bumps of 10 microns, 30 microns, 50 microns, 100 microns, 50-100 microns, or 30-1000 microns. There may be any number of bumps 34 on a single microelectronic element 30, including tens of bumps, hundreds of bumps, or thousands of bumps.

The bumps 34 and the recesses 24 can have corresponding top-view geometric configurations, such that each bump can be aligned with a corresponding recess as shown in FIG. 1A.

In a particular example, there may not be a one-to-one correspondence between the top-view geometric configurations of the bumps 34 and the recesses 24. For example, in one embodiment, the bumps can be disposed at locations within an m×n array, with some locations not having a bump, such that when the bond material of the bumps 34 mechanically engages the handling substrate 20 as shown in FIG. 1B, some of the recesses 24 can remain unoccupied.

A method of moving the microelectronic element 30 will now be described, with reference to FIGS. 1A and 1B. First, the handling substrate 20 can be aligned with the microelectronic element 30, so that the bumps 34 are aligned with corresponding ones of the recesses 24. As used herein, bumps 34 being aligned with recesses 24 means that the bumps and the recesses at least partially overlie one another in a top view, such that a line can be drawn in a direction D1 perpendicular to the first surface 21 of the handling substrate 20 that intersects a corresponding bump and recess.

Next, the bumps 34 can be reflowed so that at least some of the bond metal thereof liquefies and flows at least partially into corresponding ones of the recesses 24 and solidifies therein such that the reflowed bond material in at least some of the recesses mechanically engages the handling substrate 20. As used herein, the bumps 34 are mechanically engaged with the recesses 24 when the bumps and recesses are interlocked so that there is contact between surfaces of the bumps and recesses, and such contact produces a mechanical retention force applied from the handling substrate 20 onto the reflowed bond material of the microelectronic element 30 that is sufficient to prevent gravitational forces from pulling the microelectronic element out of engagement with the handling substrate. In one example, the retention force can be at least 2 psi. In an exemplary embodiment, the retention force can be at least 200 psi. In one example, the retention force can be at least 2,000 psi. In a particular embodiment, the retention force can be at least 3,000 psi.

The reflowing can be performed by heating the bumps 34 above the melting temperature of the bond metal thereof so that the bumps are liquefied, and then cooling the bumps so that they return to a solid state. In one example, the reflowing of the bumps 34 can be performed while the assembly 10 is in at least a partial vacuum (i.e., below atmospheric pressure). In a particular example, the reflowing of the bumps 34 can be performed while the assembly 10 is in an inert ambient environment (e.g., nitrogen) or a reducing environment (e.g., a forming gas comprising nitrogen and hydrogen). Performing the reflowing of the bumps 34 in a partial vacuum, in an inert ambient environment, or in a reducing environment may help prevent the bumps 34 from oxidizing during reflow.

Then, the microelectronic element 30 can be moved by moving the handling substrate 20 with the microelectronic element attached thereto. Next, the microelectronic element 30 can be placed in a desired location, and the microelectronic element can be released from the handling substrate 20 by reflowing the bumps 34 above the melting temperature of the bond metal thereof so that at least some of the bond metal of the bumps liquefies and flows out of the corresponding recesses 24. In a particular embodiment, each bump 24 can have an initial volume before the bond material thereof flows into the corresponding recess 34 (FIG. 2A) and a final volume after the at least some of the bond material thereof flows out of the corresponding recess, and the final volume can be equal to the initial volume.

Figure 2A:
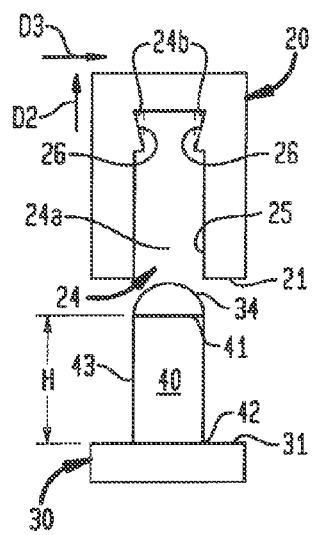
FIG. 2A is one potential enlarged side sectional view of a portion of the handling substrate and microelectronic element of FIG. 1A.
Figure 2B:
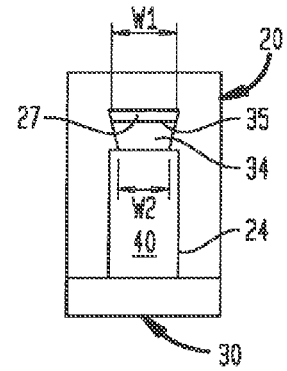
FIG. 2B is one potential enlarged side sectional view of a portion of the handling substrate and microelectronic element of FIG. 1B.

As shown in FIGS. 2A and 2B, in one embodiment, the electrically conductive bumps 34 each can be disposed at an end 41 of a solid metal pillar 40. Each pillar 40 can have a base 42 adjacent the front surface 31 of the microelectronic element 30, the end being remote from the base. When the handling substrate 20 and the microelectronic element 30 are aligned so that they can be mechanically engaged with one another, at least some of the solid metal pillars 40 can be inserted into corresponding ones of the recesses, as shown in FIG. 2B.

As can be seen in FIG. 2A, the recess 24 can include an entry portion 24a and one or more transverse portions 24b. The entry portion 24a can extend from the first surface 21 of the handling substrate in a first direction D2 towards the second surface 22. Each transverse portion 24b can extend in a second direction transverse to the first direction D1 away from the entry portion 24a, for example, the direction D3 shown in FIG. 2A.

As shown in FIG. 2A, the recess 24 can have at least one surface 26 that is reentrant with respect to the first surface 21 of the handling substrate 20. In the embodiment shown in FIGS. 2A and 2B, the transverse portions 24b can each have therein at least one surface 26 that is reentrant with respect to the first surface 21 of the handling substrate 20.

A reentrant surface of the recess 24 such as the surface 26 can be considered to have a "negative angle" with respect to the first surface 21 of the handling substrate 20. As used herein, the term "negative angle" as applied to a first surface with respect to a second surface means that the second surface "shields" or "shades" the first surface from exposure to a beam of particles, radiation, or the substantial flow of a gas traveling in a direction from the second surface past the location of the first surface. For example, the reentrant surface 26 extends underneath a portion of the first surface 21 such that the first surface shields or shades the reentrant surface from a beam or a gas flowing in a direction from the first surface into the recess 24. Each transverse portion 24b of the recess 24, in such case, can be referred to as having "reentrant" shape with respect to the entry portion 24a of the recess.

FIG. 2B shows the bump 34 engaged with a corresponding one of the recesses 24. After the reflowing step described above, at least some of the bumps 34 can each define a first width W1 within the corresponding recess 24 in a first direction D4 parallel to the first surface 21 of the handling substrate 20 greater than a second width W2 of the corresponding recess in the first direction, the second width located between the first width and the first surface.

In an exemplary embodiment, as shown in FIG. 2A, the bump 34 may not contact sidewalls 43 of the solid metal pillar 40 on which it is disposed, the sidewalls of each solid metal pillar extending between the base 42 and the end 41 thereof in a direction perpendicular to the first surface 31 of the microelectronic element 30. In one example, each of the bumps can contact at least a portion of the sidewalls 43 of the solid metal pillar 40 on which it is disposed. In a particular embodiment, each of the bumps 34 can contact 10% or less of a height H of the sidewalls 43 of the solid metal pillar 40 on which it is disposed, the height of the sidewalls of each solid metal pillar extending between the base 42 and the end 41 thereof in a direction perpendicular to the first surface 31 of the microelectronic element 30.

In one example, 90% or more of the height H of the sidewalls 43 of each of the solid metal pillars can be non-wettable by the bond metal of which the bumps 34 are formed. Such non-wettable portions of the sidewalls 43 can serve to prevent the material of the bumps 34 from extending down the non-wettable portions of the sidewalls to contact the first surface 31 of the microelectronic element or the first surface 21 of the handling substrate.

In a particular example, after the reflowing step, the bump 34 can define an upper surface 35 that confronts and is spaced apart from at least one upper surface 27 of the corresponding recesses 24 into which the bump flows.

Figure 2C:
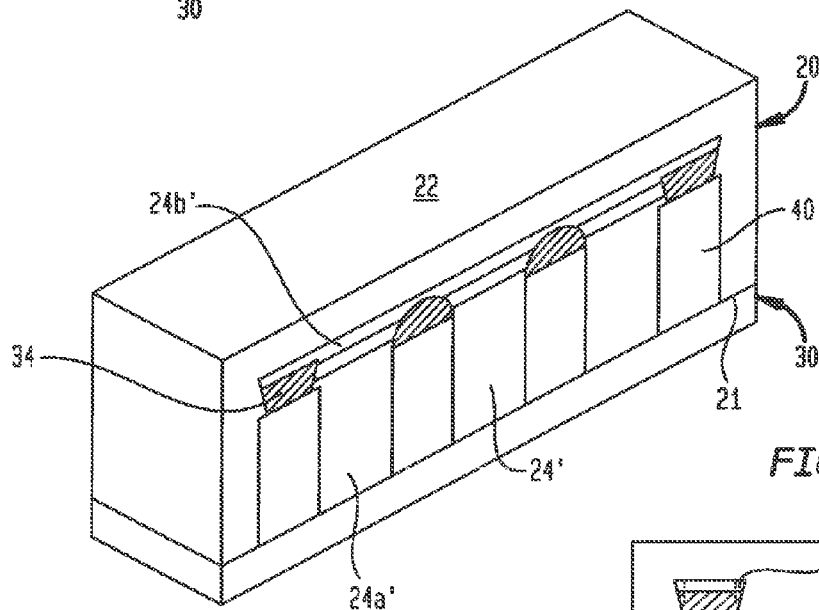
FIG. 2C is an enlarged side sectional view of a variation of the handling substrate and microelectronic element of FIG. 2A having a common recess.

In a particular embodiment, as shown in FIG. 2C, one or more of the recesses extending into the handling substrate 20 can each be a single common recess 24', into which a plurality of the bumps 34 and pillars 40 extend. Such a single common recess 24' can have a variety of shapes, such as a circle, a square, an elongated shape such as an oval or a rectangular channel, a more complex shape such as an L or a T shape, or any other shape.

Figure 2D:
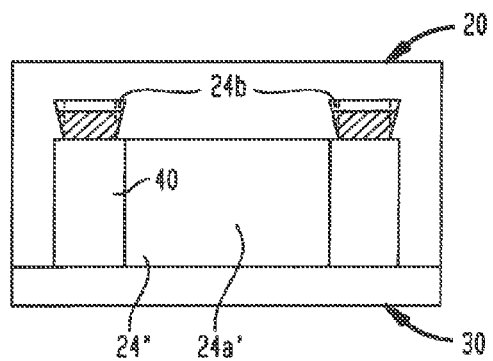
FIG. 2D is an enlarged side sectional view of another variation of the handling substrate and microelectronic element of FIG. 2A having a common recess.

In one example, each of the pillars 40 extending within a single recess 24' can be electrically connected with a different potential. Alternatively, one or more of such pillars 40 extending within a single recess 24' can be shorted with one another, such that they are electrically connected with the same potential, for example, a reference potential. As shown in FIG. 2C, such a single recess 24' can have one or more common transverse portions 24b' extending from an entry portion 24a'. In a particular example, as shown in FIG. 2D, a single common recess 24" can have a single entry portion 24a' and a plurality of separate transverse portions 24b extending therefrom, such that the bump 34 of each individual pillar 40 can extend into corresponding ones of the transverse portions.

Figure 3C:
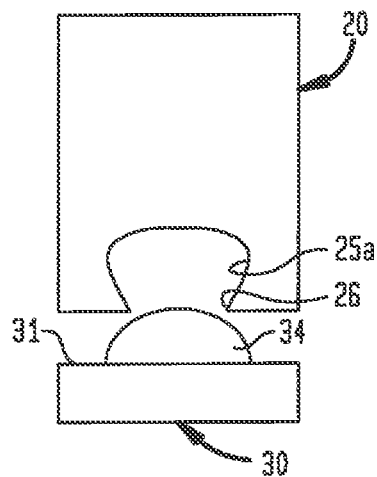
FIG. 3C is yet another potential enlarged side sectional view of a portion of the handling substrate and microelectronic element of FIG. 1A.
Figure 3D:
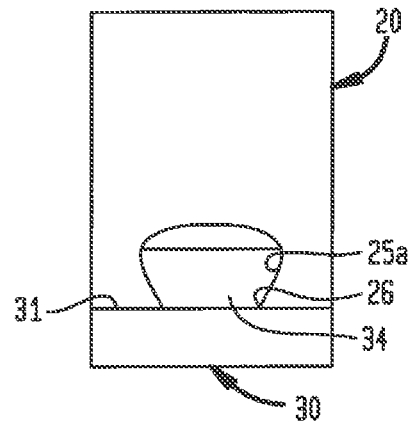
FIG. 3D is yet another potential enlarged side sectional view of a portion of the handling substrate and microelectronic element of FIG. 1B.

In one example, as shown in FIGS. 3A and 3B, the bumps 34 can be disposed on the front surface 31 of the microelectronic element 30, rather than the bumps being disposed atop respective conductive pillars. FIGS. 3C and 3D show a variation of the embodiment shown in FIGS. 3A and 3B, where the recess 24 has at least one inner surface 25a that has a curvilinear shape. In such an embodiment, a curvilinear portion of at least one inner surface 25a can be a reentrant surface 26.

In a particular embodiment, as shown in FIGS. 4A through 5B, an assembly 110 can include a handling substrate 120 and a microelectronic element 130. The handling substrate 120 is the same as the handling substrate 20 shown in FIGS. 1A and 1B, except that the recesses are omitted, and the handling substrate 120 has wettable electrically conductive elements 124 (FIG. 5A) exposed at the first surface 121. As can be seen in FIG. 5A, each bump 134 can be disposed at a top surface 141 of a conductive element 140, each conductive element 140 having a bottom surface 142 adjacent the front surface of the microelectronic element 130, the top surface being remote from the bottom surface. In the example shown in FIGS. 5A and 5B, the conductive elements 124 and 140 are shown as conductive pads, but in other examples, the conductive elements may take other forms, such as solid metal pillars.

Although the structure shown in FIGS. 4A through 5B does have recesses, the handling substrate 120 can bond with the microelectronic element 130 by having the bonding material of the bumps 134 form intermetallic bonds with the conductive elements 124 and 140, and those intermetallic bonds can produce a mechanical retention force applied from the handling substrate 120 onto the reflowed bond material of the microelectronic element 130 that is sufficient to prevent gravitational forces from pulling the microelectronic element out of engagement with the handling substrate.

FIGS. 5C and 5D show a variation of the structure shown in FIGS. 5A and 5B that may be substituted in the assembly 110 shown in FIGS. 4A and 4B. In FIGS. 5C and 5D, the wettable electrically conductive elements 124b are each exposed at the first surface 121 within a recess 124a. The recesses 124a are shown as having a curvilinear cross-sectional shape, but in other embodiments, the recesses may have any other cross-sectional shape, such as a rectangular shape. Although the recesses 124a do not have reentrant surfaces such as the reentrant surfaces 26 described above, the handling substrate 120a can bond with the microelectronic element 130 by having the bonding material of the bumps 134 form intermetallic bonds with the conductive elements 124b and 140, and those intermetallic bonds can produce a mechanical retention force as described above with reference to the other embodiments.

Figure 6:
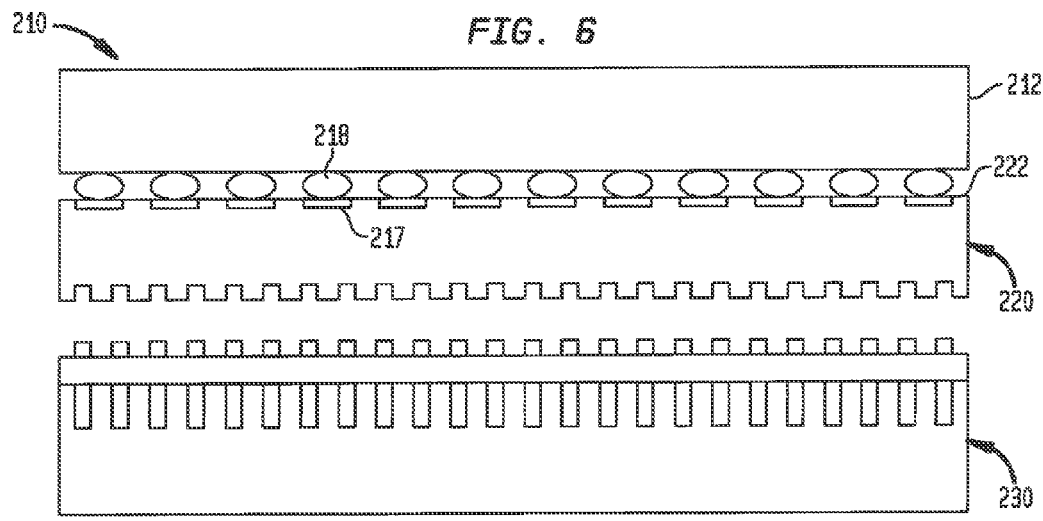
FIG. 6 is a side sectional view of a handling substrate and a microelectronic element in a disengaged position, illustrating an apparatus in accordance with yet another embodiment.
Figure 7A:
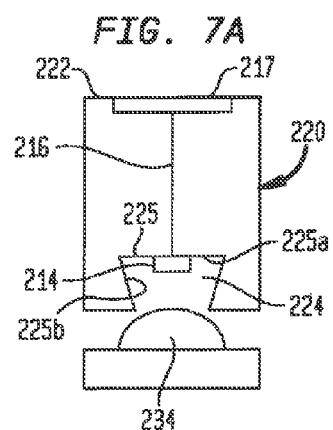
FIGS. 7A and 7B are potential enlarged side sectional views of the handling substrate and microelectronic element of FIG. 6 in respective disengaged and engaged positions.
Figure 7B:
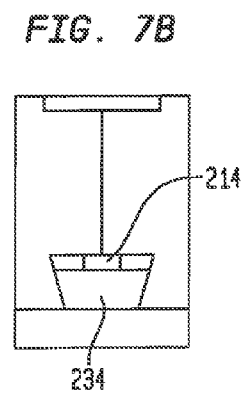

Referring now to FIGS. 6 through 7B, an assembly 210 can include a handling substrate 220, a microelectronic element 230, and a testing component 212 that is configured to electrically test the microelectronic element. As can be seen in FIG. 7A, the handling substrate 220 is the same as the handling substrate 20 shown in FIGS. 1A and 1B, except that the handling substrate 220 has a plurality of conductive elements 214 each exposed at at least one of the inner surfaces 225 of the corresponding recesses 224.

At least some of the conductive elements 214 can be electrically connected with the testing component 212 through conductive structure 216. In one example, the conductive structure 216 can include conductive pads 217 exposed at the second surface 222 of the handling substrate 220, and conductive joining material 218 electrically connecting the conductive pads to conductive elements of the testing component 212.

Although in the figures, the conductive element 214 is shown exposed at an upper surface 225a, in other embodiments, one or more of the conductive elements 214 can be exposed at any of the inner surfaces 225 of the corresponding recess 224, such as, for example, a side surface 225b.

Figure 7C:
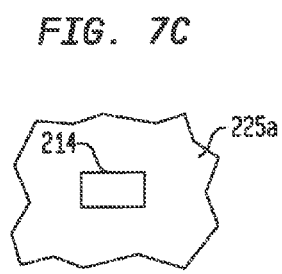
FIG. 7C is a potential enlarged bottom view of the conductive element of FIG. 7A, according to one embodiment.
Figure 7D:
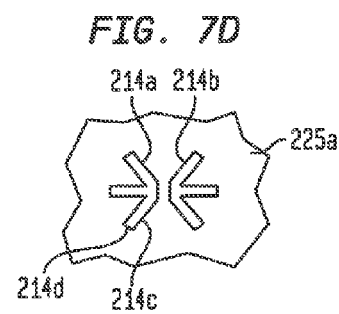
FIG. 7D is another potential enlarged bottom view of the conductive element of FIG. 7A, according to a variation of the embodiment shown in FIG. 7C.

The conductive element 214 can have any number of continuous or discontinuous portions having any bottom view shape. For example, as shown in FIG. 7C, the conductive element 214 can have a single continuous portion having a rectangular bottom view shape. In another example, FIG. 7D shows an embodiment having a plurality of discontinuous conductive element portions 214a and 214b each having an irregular shape with a plurality of lobes 214c having spaced-apart ends 214d. Each of the portions 214a and 214b can be electrically connected to a single conductive pad 217 at the second surface 222 of the handling substrate 220.

As shown in FIG. 7B, a sufficient volume of bond metal can be included in the bumps 234 so that, after the bumps are reflowed and the handling substrate 220 and the microelectronic 230 are mechanically engaged with one another, there is an electrical connection between the bumps and the corresponding conductive elements 214. After the reflowing step, the microelectronic element 230 can be electrically tested through the electrical connections made through the handling substrate 220 and the reflowed bond metal of the bumps 234.

Figure 8A:
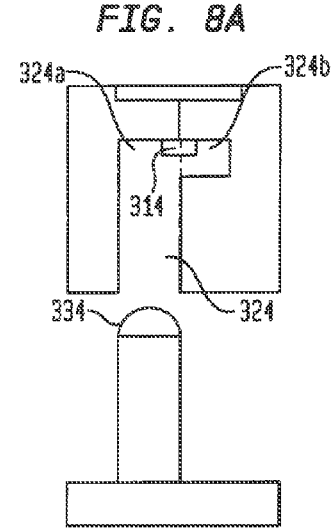
FIGS. 8A and 8B are potential enlarged side sectional views of the handling substrate and microelectronic element of FIG. 6 in accordance with an alternative embodiment of the apparatus shown in FIGS. 7A and 7B.
Figure 8B:
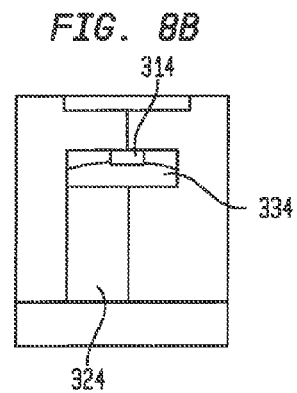

In one example, as shown in FIGS. 8A and 8B, a recess 324 have an entry portion 324a and a single transverse portion 324b extending in a transverse direction from the entry portion. After the reflowing step, the bump 334 can extend across the entry portion 324a and the transverse portion 324b. The conductive element 314 that can provide an electrical connection to a component that is configured to electrically test the microelectronic element 330 can be located at least partially within both the entry portion 324a and the transverse portion 324b.

Figure 9A:
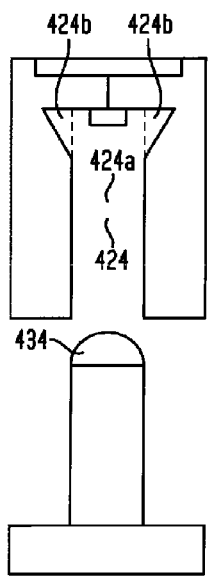
FIGS. 9A and 9B are potential enlarged side sectional views of the handling substrate and microelectronic element of FIG. 6 in accordance with an alternative embodiment of the apparatus shown in FIGS. 8A and 8B.
Figure 9B:
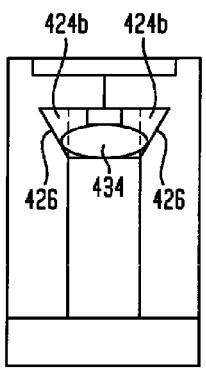

In a particular embodiment, as shown in FIGS. 9A and 9B, a recess 424 can have an entry portion 424a and two transverse portion 424b extending in a transverse direction from the entry portion. After the reflowing step, the bump 434 can extend across the entry portion 424a and both transverse portions 424b. The bump 434 can contact a reentrant surface 426 in both of the transverse portions 424b.

Figure 10A:
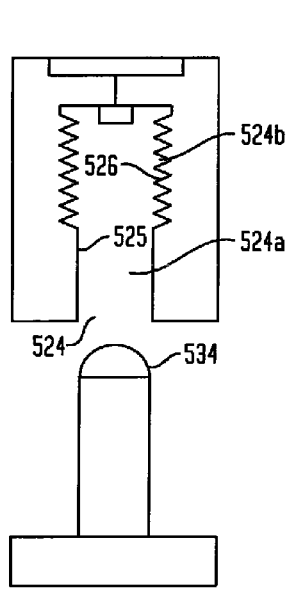
FIGS. 10A and 10B are potential enlarged side sectional views of the handling substrate and microelectronic element of FIG. 6 in accordance with an alternative embodiment of the apparatus shown in FIGS. 8A and 8B.
Figure 10B:
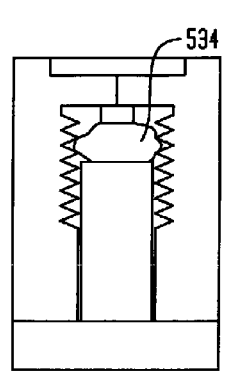

In one example, as shown in FIGS. 10A and 10B, a recess 524 have an entry portion 524a and a plurality of transverse portions 524b each extending in a transverse direction from the entry portion. After the reflowing step, the bump 534 can extend across the entry portion 524a into one or more of the transverse portions 524b. The bump 534 can contact a reentrant surface 526 in one or more of the transverse portions 524b. As shown, the reentrant surfaces 526 can be portions of serrations extending along the inner surfaces 525 of the recess 524.

FIGS. 11A and 11B show a microelectronic element 630 that may be the same as the microelectronic element 30 shown in FIGS. 1A and 1B, except the microelectronic element 630 has been thinned to expose portions of the conductive vias 638 at the rear surface 632 for interconnection with a component external to the microelectronic element.

As shown in FIG. 11A, after the handling substrate 620 has been joined with the microelectronic element 630, a thickness of the microelectronic element between the front and rear surfaces 631, 632 can be reduced by removing material from the rear surface, thereby exposing portions of the conductive vias 638 at the rear surface. As shown in FIG. 11B, lateral clamps 650 can be used to secure the thinned microelectronic element 630 during reflow of the bumps 634 to disengage the microelectronic element from the handling substrate 620.

Figure 12:
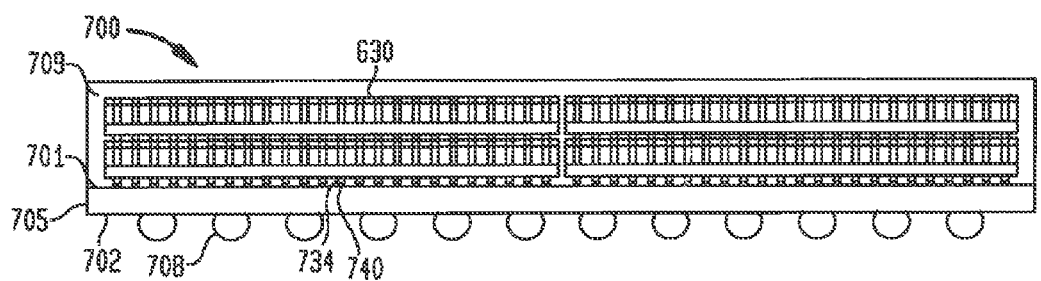
FIG. 12 is a side sectional view of a stacked assembly including a plurality of the microelectronic element of FIGS. 11A and 11B.

As shown in FIG. 12, once the microelectronic element 630 has been thinned, one or more of the microelectronic elements can be assembled with a package substrate 705 by electrically connecting conductive elements of the microelectronic elements to corresponding conductive elements 740 exposed at a first surface 701 of the package substrate with joining units 734, such joining units including a bond metal, for example. Joining units 708 can be exposed at a second surface 702 of the package substrate 705 for interconnection with a component external to the package substrate. An overmold or encapsulant 709 may be provided to at least partially cover the microelectronic elements 630.

As can be seen in FIG. 12, the microelectronic assembly 700 has four microelectronic elements 630, with a first two microelectronic elements disposed adjacent the first surface 701 of the package substrate 705 and third and fourth microelectronic elements stacked overlying the respective first and second microelectronic elements. However, in other embodiments, any number of microelectronic elements 630 can be mounted to a package substrate and stacked in any configuration thereon.

Figure 13A:
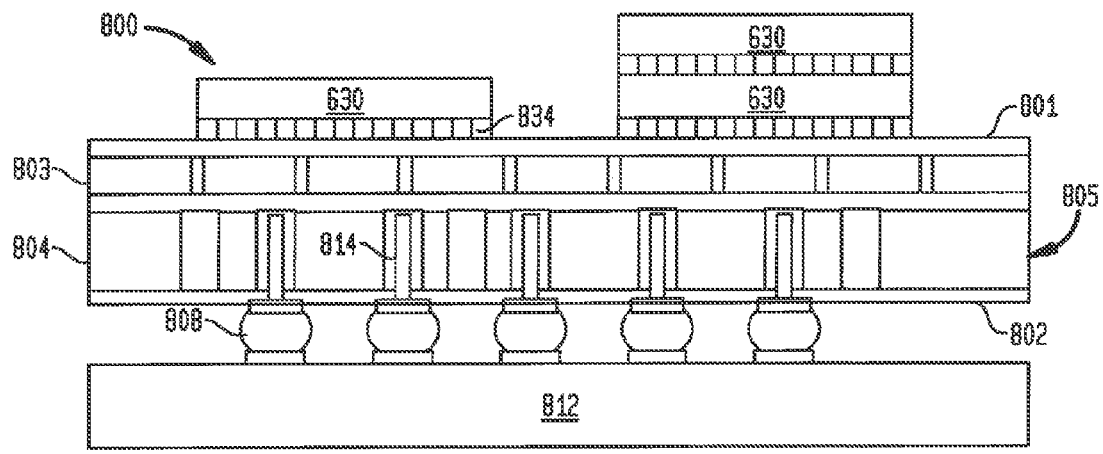
FIGS. 13A and 13B are a side sectional view and a top plan view of another stacked assembly including a plurality of the microelectronic element of FIGS. 11A and 11B.
Figure 13B:
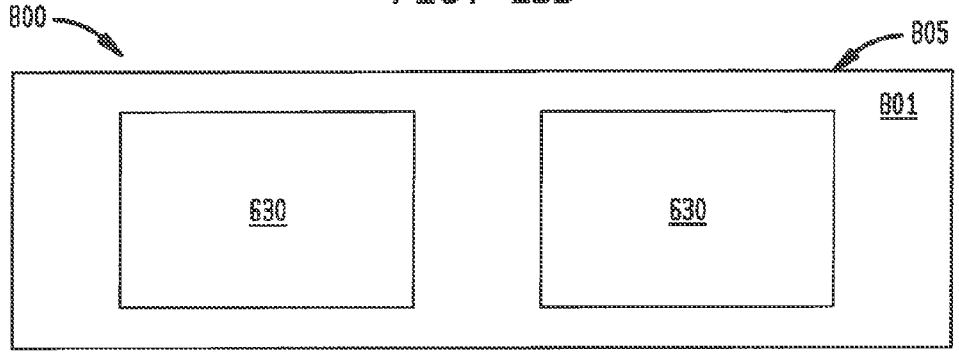

In one example, as shown in FIGS. 13A and 13B, once the microelectronic element 630 has been thinned, one or more of the microelectronic elements can be assembled with an interconnection element 805 by electrically connecting conductive elements of the microelectronic elements to corresponding conductive elements exposed at a first surface 801 of the interconnection element with joining units 834, such joining units including a bond metal, for example. Joining units 808 can be exposed at a second surface 802 of the interconnection element 805 for interconnection with a component external to the package substrate, such as a circuit panel 812.

The interconnection element 805 can include a composite material, a silicon substrate 803 joined with a glass substrate 804, for example, that has an effective CTE that is tunable during fabrication of the substrate to approximately match the CTE of the metal of conductive vias 814 that extend therein, such as copper or nickel. For example, the interconnection element 805 can have an effective CTE that is tunable to a value between 10-20 ppm/° C. In a particular embodiment, the interconnection element 805 can have an effective CTE that is tunable to a value between 15-18 ppm/° C.

Referring now to FIGS. 14A through 15C, an assembly 910 can include a testing substrate 920, a microelectronic element 930, and a testing component (not shown in FIGS. 14A and 14B, but the same as the testing component 212 that is shown in FIG. 6) that is configured to electrically test the microelectronic element. The testing substrate 920 is the same as the handling substrate 20 shown in FIGS. 1A and 1B, except that the testing substrate 920 has a plurality of compliant conductive elements 914 each exposed at at least one of the inner surfaces 925 of the corresponding recesses 924. At least some of the conductive elements 914 can be electrically connected with the testing component through conductive structure of the testing substrate 920.

In one example, each compliant element 914 can consist essentially of a compliant metal or metal alloy. In a particular embodiment, at least a portion of each compliant element 914 can include a conductive fluid therein, for example, such as a conductive paste.

As shown in FIG. 15A, the microelectronic element 930 can have a plurality of spaced-apart electrically conductive protrusions 940 exposed at a front surface 931 thereof. In the example shown in FIGS. 15A-15C, the protrusions 940 can be solid metal pillars, but that need not be the case.

As shown in FIG. 15B, the protrusions 940 can deformably engage corresponding ones of the compliant elements 914 of the testing substrate 920, the protrusions extending into interior cavities 916 of the compliant elements defined by the protrusions. The microelectronic element 930 can be electrically tested while the protrusions 940 are engaged with the compliant elements 914. As shown in FIG. 15C, after the protrusions 940 are withdrawn from the recesses 924, the compliant elements 914 can be reflowed to remove the interior cavities 916 of the compliant elements that were defined by the protrusions. In a particular example, the compliant elements 914 can be reflowed during withdrawal of the protrusions 940 from the recesses 924.

Referring now to FIGS. 16A and 16B, a first substrate 1020 and a second substrate 1030 can be joined to one another using a similar structure as that described above with reference to FIGS. 1A and 1B. The first and second substrates 1020 and 1030 can be removably joined or permanently bonded with one another. Such joining of the first and second substrate 1020 and 1030 can be used for any of the purposes described above, including, for example, removable bonding for moving of the second substrate 1030, electrical testing of the second substrate, permanent bonding of the first and second substrates, heat management of one or both of the first and second substrates, or stiffening (i.e., mechanical support) of one or both of the first and second substrates.

As shown in FIGS. 16A and 16B, the first substrate 1020 can have a first surface 1021 and a second surface 1022 opposite therefrom, and a plurality of spaced-apart recess 1024 extending from the first surface towards the second surface. The second substrate 1030 can have a front surface 1031 and a rear surface 1032 opposite therefrom, and a plurality of spaced-apart electrically conductive bumps 1034 each including a bond metal and each exposed at the front surface of the second substrate. Each of the electrically conductive bumps 1034 can be disposed at an end 1041 of a corresponding solid metal pillar 1040. When the first and second substrates 1020, 1030 are aligned so that they can be joined to one another, at least some of the solid metal pillars 1040 can be inserted into corresponding ones of the recesses 1024, as shown in FIG. 16B.

In a particular example, the conductive bumps 1034 can be reflowed so that the bond material in at least some of the recesses 1024 at least one of mechanically or electrically engages the first substrate 1020. A first portion P1 of the surface area of inner surfaces 1025 of at least some of the recesses 1024 can be wettable by the bond metal of which the bumps 1034 are formed, and a second portion P2 of the surface area of the inner surfaces of the at least some of the recesses can be non-wettable by the bond metal of which the bumps are formed. To form the non-wettable second portion P2 of the surface area of the inner surfaces 1025, the first wettable portion P1 can be masked with lithographical or physical masking, and a layer of non-wettable material such as Teflon or Parylene can be deposited onto the second portion P2.

As shown in FIGS. 16A and 16B, the second portion P2 can be adjacent the first surface 1021 of the first substrate 1020, and the second portion P2 can separate the first portion P1 from the first surface of the first substrate, so that the bumps 1034 won't extend out of the recesses when they are reflowed. The non-wettable second portion P2 can act as a barrier to contain the bumps 1034 so that they remain adjacent the wettable first portion P1.

In a particular example, the first portion P1 (i.e., the wettable portion) of the surface area of the inner surfaces 1025 of at least some of the recesses 1024 can extend over at least 50% of the surface area of the inner surfaces of each of the respective recesses, and the second portion P2 (i.e., the non-wettable portion) can extend over at least 25% of the surface area of the inner surfaces of the at least some of the recesses, the second portion being adjacent to the first surface 1021 of the substrate 1020 and separating the first portion from the first surface.

Each of the first and second portions P1 and P2 of the surface area of the inner surfaces 1025 of at least some of the recesses 1024 can have any number of continuous or discontinuous portions. In one example, the first portion P1 and the second portion P2 can each be single continuous portions of the inner surfaces 1025. Alternatively, one or both of the first portion P1 and the second portion P2 can include plurality of discontinuous portions that are spaced apart from one another. For example, in one embodiment, a particular recess 1024 can include a plurality of discontinuous wettable first portions P1 that are spaced apart from one another by parts of a single continuous non-wettable second portion P2.

In an exemplary embodiment, one or both of the first and second substrates 1020 and 1030 can be a microelectronic element. In one example, each of the first and second substrates 1020 and 1030 can be microelectronic elements each having at least one of active or passive devices therein. Such active and/or passive devices can be disposed in one or more device regions thereof located at and/or below a surface of one or both of the first and second substrates 1020 and 1030.

FIGS. 16C and 16D show a variation of the embodiment shown in FIGS. 16A and 16B, in which a first substrate 1020' is joined with second and third substrates 1030a and 1030b. The structure of the interface between the first and second substrates 1020' and 1030a, as well as the structure of the interface between the first and third substrates 1020' and 1030b, is the same as the structure of the interface between the first and second substrates 1020 and 1030 shown in FIGS. 16A and 16B, such that the first substrate 1020' can be removably joined or permanently bonded with the second and third substrates 1030a and 1030b.

FIG. 16E shows another variation of the embodiment shown in FIGS. 16A and 16B, in which one or more recesses extending into the handling substrate 20 can each be a single common recess 1024', into which a plurality of the bumps 1034 and pillars 1040 extend. Such a single common recess 1024' can have a variety of shapes, such as a circle, a square, an elongated shape such as an oval or a rectangular channel, a more complex shape such as an L or a T shape, or any other shape. In one example, each of the pillars 1040 extending within a single recess 1024' can be electrically connected with a different potential. Alternatively, one or more of such pillars 1040 extending within a single recess 1024' can be shorted with one another, such that they are electrically connected with the same potential, for example, a reference potential.

The components described above can be utilized in construction of diverse electronic systems, as shown in FIG. 17. For example, a system 1700 in accordance with a further embodiment of the invention includes a microelectronic element 1706 as described above in conjunction with other electronic components 1708 and 1710. In the example depicted, component 1708 is a semiconductor chip whereas component 1710 is a display screen, but any other components can be used. Of course, although only two additional components are depicted in FIG. 17 for clarity of illustration, the system may include any number of such components. The microelectronic element 1706 may be any of the microelectronic elements or microelectronic assemblies described above. In a further variant, any number of such microelectronic elements 1706 can be used.

The microelectronic element 1706 and components 1708 and 1710 can be mounted in a common housing 1701, schematically depicted in broken lines, and can be electrically interconnected with one another as necessary to form the desired circuit. In the exemplary system shown, the system can include a circuit panel 1702 such as a flexible printed circuit board, and the circuit panel can include numerous conductors 1704, of which only one is depicted in FIG. 17, interconnecting the components with one another. However, this is merely exemplary; any suitable structure for making electrical connections can be used.

The housing 1701 is depicted as a portable housing of the type usable, for example, in a cellular telephone or personal digital assistant, and screen 1710 can be exposed at the surface of the housing. Where the microelectronic element 1706 includes a light-sensitive element such as an imaging chip, a lens 1711 or other optical device also can be provided for routing light to the microelectronic element. Again, the simplified system shown in FIG. 17 is merely exemplary; other systems, including systems commonly regarded as fixed structures, such as desktop computers, routers and the like can be made using the structures discussed above.

The openings, apertures, and conductive elements disclosed herein can be formed by processes such as those disclosed in greater detail in U.S. Patent Application Publication Nos. 2008/0246136, 2012/0018863, 2012/0018868, 2012/0018893, 2012/0018894, 2012/0018895, and 2012/0020026, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
a first substrate having a plurality of spaced-apart recesses ("recesses") therein as extending from a first surface thereof;
a second substrate having a plurality of spaced-apart solid metal pillars ("pillars") exposed at a first surface thereof, each pillar of the pillars extending into a corresponding one of the recesses and having a base adjacent the first surface of the second substrate and an end remote from the base;
a plurality of bumps, each including a bond metal, respectively exposed at ends of the pillars, at least some of the bond metal of each of the bumps at least partially disposed in corresponding ones of the recesses and solidified therein to engage with a first portion of surface area of inner surfaces of the recesses for mechanical retention to in addition to electrical conductivity with the first substrate;
wherein the first portion of the surface area of the inner surfaces of the recesses are wettable by the bond metal of the plurality of bumps, and a second portion of the surface area of the inner surfaces of the recesses are non-wettable by the bond metal of the bumps at the melting point of the bond metal;
a non-wettable layer disposed in the recesses corresponding to the second portion of the surface area of the inner surfaces for being adjacent to the first surface of the first substrate and for separating the first portion of the surface area of the inner surfaces of the recesses from the first surface of the first substrate to provide a non-wetting surface barrier with respect to the bond metal after being reflowed for having the bond metal remain adjacent the first portion of the surface area of the inner surfaces of the recesses after reflow; and
wherein the second portion of the surface area of the inner surfaces of the at least some of the recesses comprises a reentrant surface prior to the bond metal being reflowed for mechanical retention of the first substrate and the second substrate to one another after reflow of the bond metal.

2. The microelectronic assembly as claimed in claim 1, wherein at least some of the first portion or at least some of the second portion include a plurality of discontinuous portions.

3. The microelectronic assembly as claimed in claim 1, wherein at least some of the pillars extend into a single common one of the recesses.

4. The microelectronic assembly as claimed in claim 1, wherein at least one of the first and second substrates is a microelectronic element having at least one of active or passive devices therein.

5. The microelectronic assembly as claimed in claim 1, wherein the recesses are a first plurality of recesses and the bumps are a first plurality of bumps, the first substrate having a second plurality of spaced-apart recesses ("second recesses") extending from a second surface thereof opposite the first surface, the microelectronic assembly further comprising:

a third substrate having a second plurality of spaced-apart solid metal pillars ("second pillars") exposed at a first surface thereof, each pillar of the third substrate extending into a corresponding one of the second recesses and having a base adjacent the first surface of the third substrate and an end remote from the base; and a second plurality of bumps each including the bond metal, each of the second plurality of bumps exposed at the end of a corresponding one of the second pillars of the third substrate, at least some of the bond metal of each of the second plurality of bumps at least partially disposed in corresponding ones of the second recesses and solidified therein such that the bond metal in at least some of the second recesses mechanically engages the third substrate.

6. A handling substrate, comprising:

a body having first and second opposed surfaces;

a plurality of spaced-apart recesses ("recesses") in the body of the handling substrate extending from the first surface, the recesses each having disposed on inner surfaces thereof a non-wettable layer with respect to a bond metal at the melting point of the bond metal to provide a non-wetting surface barrier with respect to the bond metal after being reflowed for having the bond metal remain adjacent the inner surfaces of the recesses after reflow; and a plurality of conductive elements ("conductive elements") each exposed at the inner surfaces of corresponding ones of the recesses, at least some of the conductive elements being electrically connected with a component that is configured to electrically test the microelectronic element;

wherein at least some of the recesses each have at least one reentrant surface prior to reflow of the bond metal for mechanical retention after reflow of the bond metal.

7. The handling substrate as claimed in claim 6, wherein the body of the handling substrate has a coefficient of thermal expansion ("CTE") in a plane of the handling substrate parallel to the first surface thereof of less than 10 ppm/° C.

8. The handling substrate as claimed in claim 6, wherein the body of the handling substrate consists essentially of glass or silicon.

9. The handling substrate as claimed in claim 6, wherein the at least some of the recesses each have the at least one reentrant surface with respect to the first surface of the body for mechanical engagement with the bond metal.

10. The handling substrate as claimed in claim 6, wherein the at least some of the recesses each have an entry portion and a transverse portion, the entry portion extending from the first surface in a first direction towards the second surface, the transverse portion extending in a second direction transverse to the first direction away from the entry portion, the transverse portion having therein the at least one reentrant surface with respect to at least one of the first surface or a surface of the entry portion.

11. The handling substrate as claimed in claim 6, wherein the non-wettable layer is of non-wettable dielectric material overlying the inner surfaces of the recesses of the handling substrate.

12. The handling substrate as claimed in claim 6, wherein each conductive element of the conductive elements has a tip that protrudes away from the inner surfaces of the recesses respectively corresponding thereto.

13. The handling substrate as claimed in claim 6, wherein an exposed surface of each of the conductive elements is non-wettable by the bond metal at the melting point of the bond metal.

14. The handling substrate as claimed in claim 6, wherein the handling substrate includes a first region consisting essentially of semiconductor material underlying the first surface and extending from a first peripheral edge of the body to a second peripheral edge of the body opposed thereto.

15. The handling substrate as claimed in claim 14, wherein the handling substrate further includes a second region having a dielectric material overlying the first region, and wherein the recesses are disposed at least partially within the second region.

* * * * *